United States Patent [19]

Takayama et al.

[11] Patent Number: 4,701,777
[45] Date of Patent: Oct. 20, 1987

[54] GATE ARRAY TYPE SEMICONDUCTOR INTEGRATED CIRCUIT DEVICE

[75] Inventors: Yoshihisa Takayama, Kawasaki; Shigeru Fujii; Tomoaki Tanabe, both of Yokohama, all of Japan

[73] Assignee: Fujitsu Limited, Kawasaki, Japan

[21] Appl. No.: 948,406

[22] Filed: Dec. 30, 1986

Related U.S. Application Data

[63] Continuation of Ser. No. 653,536, Sep. 24, 1984, abandoned.

[30] Foreign Application Priority Data

Sep. 30, 1983 [JP] Japan .................. 58-182069

[51] Int. Cl.$^4$ ............ H01L 27/02; H01L 27/10; H01L 27/15; G11C 5/02
[52] U.S. Cl. .................. 357/42; 357/43; 357/45; 357/23.11; 365/51
[58] Field of Search ........... 357/42, 43, 45, 23.11; 365/51

[56] References Cited

U.S. PATENT DOCUMENTS

| 3,955,210 | 4/1976 | Bhatia et al. | 357/43 |
| 4,412,237 | 10/1983 | Matsumura et al. | 357/45 |
| 4,611,236 | 9/1986 | Sato | 357/42 |

FOREIGN PATENT DOCUMENTS

| 0009782 | 4/1980 | European Pat. Off. |
| 0105985 | 4/1984 | European Pat. Off. |
| 1502130 | 2/1978 | United Kingdom |

Primary Examiner—Martin H. Edlow
Assistant Examiner—Robert P. Limanek
Attorney, Agent, or Firm—Staas & Halsey

[57] ABSTRACT

A gate array type semiconductor device including at least a plurality of basic cell arrays and diffusion regions for suppressing latchup in the basic cells forming the basic cell arrays. Each of the diffusion regions has a comb-shaped structure, i.e., wide tooth parts, narrow tooth parts, and a base part, formed as an integral structure. These parts partially surround each basic cell.

2 Claims, 13 Drawing Figures

GATE ARRAY TYPE SEMICONDUCTOR INTEGRATED CIRCUIT DEVICE

This is a continuation of co-pending application Ser. No. 653,536, filed on Sept. 24, 1984, now abandoned.

BACKGROUND OF THE INVENTION

1. Field of the Invention

The present invention relates to a semiconductor integrated circuit (IC) device, more particularly, to a semiconductor IC device of the gate array type fabricated with complementary metal insulator semiconductor (CMIS) transistors.

2. Description of the Related Art

The recent increase in the scale of integration of IC's and the change in user needs to small-lots of large scale integrated (LSI) semiconductor devices have led to increased emphasis on the so-called masterslice LSI semiconductor device as a means of reducing manufacturing costs and manufacturing time.

In a masterslice semiconductor device, as is well known, many basic element sets are formed in a semiconductor chip prior to determining the function to be performed by the chip. Each basic element set is fabricated with typical transistors, resistors, and so on to form a basic circuit (hereinafter referred to as a basic cell). Up to this point, the masterslice semiconductor device is mass produced in large quantities. Interconnecting lines are then formed between the basic cells and in each basic cell using a specified mask to obtain an LSI semiconductor device with the desired functional circuits.

This technique enables significant reductions in both design and manufacturing time since one need only design and fabricate the specified masks when manufacturing a new LSI semiconductor device. Furthermore, in a masterslice semiconductor device, since a large number of basic cells are regularly arranged in both the column and row directions on the semiconductor substrate and form a standardized matrix pattern, it is very easy to employ so-called computer aided automatic wiring for forming the interconnecting lines.

Such a standarized matrix pattern is usually called a "gate array". Of the different types of gate arrays, a CMIS gate array is most widely used for LSI semiconductor devices. Each of the basic cells of such an array includes CMIS transistors. CMIS transistors have the advantage of low-power operation and, therefore, a higher degree of integration of the LSI semiconductor device is possible.

CMIS gate array type LSI semiconductor devices, however, suffer from the problem of "latchup". In the latchup phenomenon, a parasitic silicon-controlled rectifier (SCR) is unwillingly created in the substrate. This SCR, when it remains on, can break the interconnecting lines and damage the basic cells.

in the prior art, latchup has been eliminated by forming n+- and p+-diffusion regions in the n-type silicon substrate and p-type well, for contact therewith, respectively. The n+- and p+-diffusion regions are formed between each two adjacent p-channel transistors of the basic cells and every two adjacent n-channel transistors of the basic cells, respectively. The insertion of n+- and p+-diffusion regions between every two adjacent basic cells impedes increases in the packing density of the basic cells and thus reduces the degree of integration of the device.

SUMMARY OF THE INVENTION

It is an object of the present invention to provide a gate array type semiconductor IC device with a high packing density of basic cells even though p+- and n+-diffusion regions are employed for elimination of latchup.

The above object is attained by employing n+-diffusion and p+-diffusion regions, each having a comb-shaped structure.

BRIEF DESCRIPTION OF THE DRAWINGS

The present invention will be more apparent from the ensuing description, made with reference to the accompanying drawings, wherein.

DESCRIPTION OF THE PREFERRED EMBODIMENTS

Before describing the preferred embodiments, a discussion will be made of a prior art semiconductor IC device for reference purposes.

Figure 1:
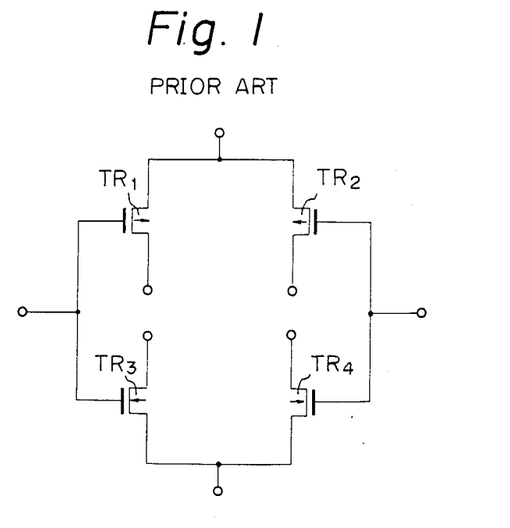
FIG. 1 is a circuit diagram of a conventional basic cell used in a CMIS gate array type LSI semiconductor device.

FIG. 1 is a circuit diagram of a conventional basic cell used in a CMIS gate array type LSI semiconductor device. The basic cell of FIG. 1, known from U.S. Pat. No. 4,412,237, includes two p-channel MIS transistors $TR_1$, $TR_2$ and two n-channel MIS transistors $TR_3$, $TR_4$. Each two MIS transistors of the same channel have a common source or drain. In addition, each two MIS transistors of different channels have common gates.

Figure 2:
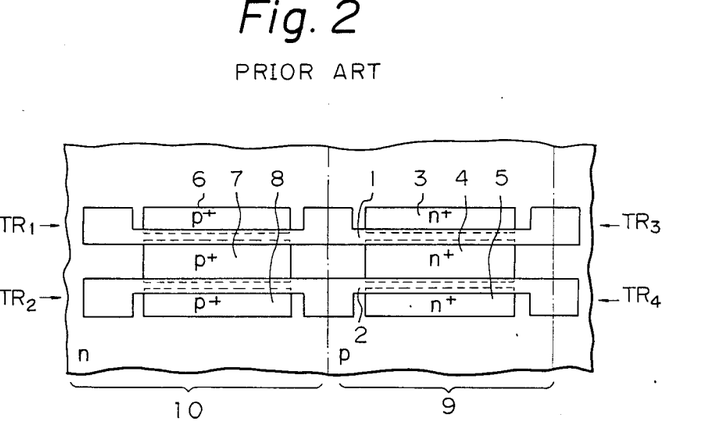
FIG. 2 is an enlarged top plan view of the basic cell shown in FIG. 1 formed on a semiconductor substrate.

FIG. 2 is an enlarged top plan view of the basic cell shown in FIG. 1 formed on a semiconductor substrate. Specifically, the pattern of the regions with impurities and the pattern of the gate electrodes for realizing the basic cell are illustrated in FIG. 2. Reference numeral 1 represents a first gate electrode wiring layer, made of, for example, polycrystalline silicon, and 2 represents a second gate electrode wiring layer, also made of polycrystalline silicon. Reference numerals 3, 4 and 5 represent n+-type regions for forming the source or drain of the n-channel transistors. Reference numerals 6, 7 and 8 represent p+-type regions for forming the source or drain of the p-channel transistors. Reference numeral 9 represents an island-like p-type region, i.e., a so-called p-type well, and 10 represents an n-type silicon substrate.

In the CMIS gate array type LSI semiconductor device, a large number of basic cells, each having the construction described above, are arranged on a single semiconductor chip in linear arrays. When the basic cells are arranged in a column direction, spaces for interconnecting lines are provided between every two basic cell in the row direction. Similar spaces are also formed between every two adjacent basic cells in the column direction.

Figure 3:
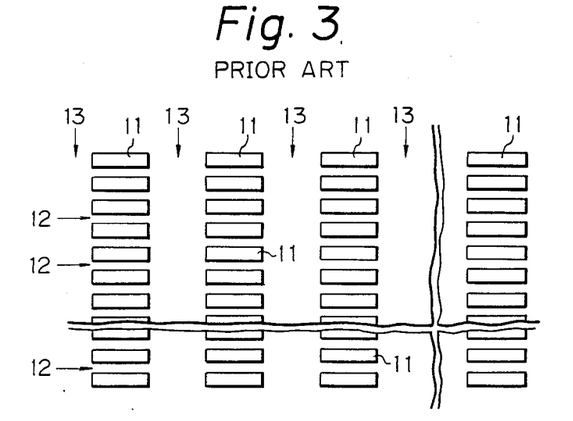
FIG. 3 is a top plan view of a basic cell arrangement on a semiconductor chip.

FIG. 3 is a top plan view of a basic cell arrangement on a semiconductor chip. In FIG. 3, reference numeral 11 represents basic cells formed as explained in detail before. Spaces 12 are formed between these basic cells 11 for arranging interconnecting lines in the row direction. At the same time, spaces 13 are formed for arranging interconnecting lines in the column direction.

In the arrangement of FIG. 3, each of the basic cell arrays includes tens to hundreds of basic cells 11 in the column direction. Tens of the basic cell arrays are arranged in the row direction. The width of each row space 12 is determined so that one to four interconnecting lines can be accommodated therein, while the width of each column space 13 is determined so that ten to several tens of interconnecting lines can be accommodated therein.

Figure 4:
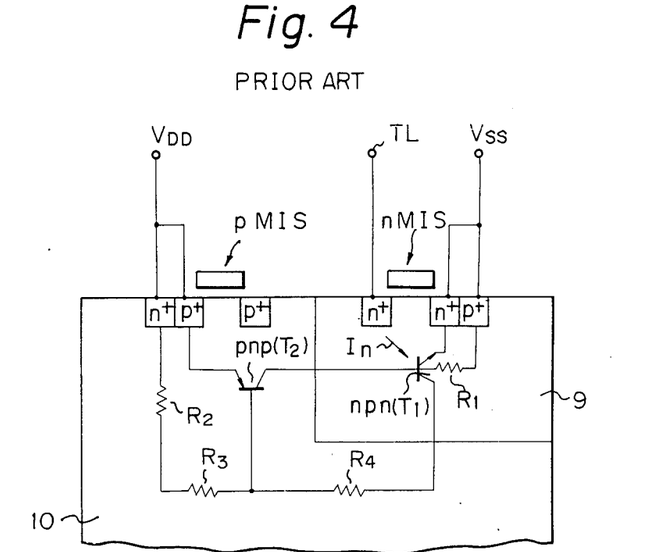
FIG. 4 is a cross-sectional view and an equivalent circuit diagram for explaining the latchup phenomenon.

The present invention is directed to the elimination of latchup in the highly dense packing of basic cells 11 as shown in FIG. 3. FIG. 4 is a cross-sectional view and equivalent circuit diagram for explaining the latchup phenomenon. In a CMIS transistor structure, when a voltage $V_{DD}$ is supplied to the p-channel MIS transistor pMIS and a voltage $V_{SS}$ is supplied to the n-channel MIS transistor nMIS, a parasitic npn transistor $T_1$ is formed in the p-type well at the nMIS side and a parasitic pnp transistor $T_2$ is formed in the n-type silicon substrate 10 at the pMIS side. Further, parasitic resistors $R_1$, $R_2$, $R_3$, and $R_4$ are defined between each emitter, base and collector of the parasitic transistors $T_1$ and $T_2$. As apparent from the equivalent circuit diagram, the parasitic transistors and the parasitic resistors provide a thyristor structure. Latchup is caused by the thus formed thyristor.

Specifically, if a noise current In having a relatively large amplitude is supplied from an external or internal terminal TL via the n+-type region connected thereto, the parasitic transistor $T_1$ is turned on, and a current starts flowing therethrough from the terminal of $V_{DD}$ to the terminal of $V_{SS}$ via the parasitic resistors $R_2$, $R_3$, and $R_4$. Therefore, the voltage level between the resistors $R_3$ and $R_4$ becomes lower than the base voltage level of the transistor $T_2$, and, thus, the transistor $T_2$ is turned on. Then, a larger base current is supplied to the transistor $T_1$ with the current supplied from the thus turned on transistor $T_2$, and thereby the transistor $T_1$ is fully turned on. As a result, a positive feedback loop is created between the parasitic transistors $T_1$ and $T_2$, and, accordingly, the thyristor enters a low resistance state. This means that once a large noise current In is received, even momentarily, a considerably large current is continuously generated between the $V_{DD}$ and $V_{SS}$ terminals. This is the latchup phenomenon.

This abnormal current continues until the power ($V_{DD}$, $V_{SS}$) is turned off. Therefore, if the power is turned off and then back on, the CMIS transistor is restored to its normal state. However, if the power remains on and the abnormal state is left as it is, the interconnecting lines may break and the basic cells may be damaged.

The higher packing density of the basic cells due to miniaturization of the CMIS transistors, the greater the chance of latchup occurring. This is because the greater the miniaturization and the higher the packing density of the basic cells, the greater the probability of the creation of parasitic transistors and resistors.

It is known that, in order to increase the suppression of latchup, the resistance values of the parasitic resistors $R_1$, $R_2$, $R_3$, and $R_4$ can be reduced by lowering the resistance values of the n-type silicon substrate 10 itself and the p-type well 9 itself. To accomplish this, an n+-diffusion region and a p+-diffusion region are formed respectively in the surface layers of the n-type silicon substrate 10 and p-type well 9, for contact therewith in the vicinity of each transistor pMIS and each transistor nMIS.

In the prior art CMIS gate array type LSI semiconductor device, the n+- and p+-diffusion regions for contact with the substrate 10 and the well 9, respectively, are formed independently in each row space 12 between every two adjacent basic cells 11. Therefore, each n+- and p+-diffusion region must make contact with the power lines of $V_{DD}$ and $V_{SS}$. This increases the width of each diffusion region and, therefore, necessitates that the basic cells in each basic cell array be separated in the column direction with a wide pitch. This impedes higher packing densities.

Figure 5:
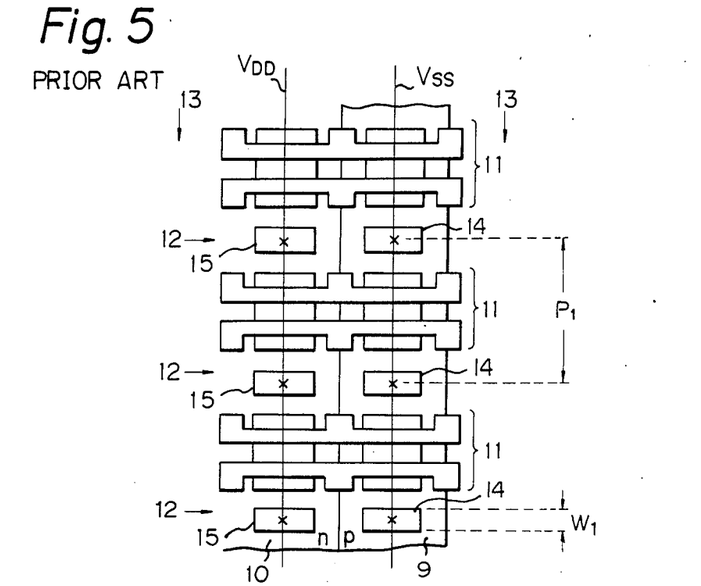
FIG. 5 is an enlarged top plan view of the partial basic cell array shown in FIG. 3.

FIG. 5 is an enlarged top plan view of the partial basic cell array shown in FIG. 3. In FIG. 5, members which are the same as those of previous figures are represented by the same reference numerals or symbols (same for later figures). As seen from FIG. 5, the prior art n+-diffusion regions 15 for contacting the n-type silicon substrate 10 are formed independently between each two adjacent basic cells 11. Similarly, the prior art p+-diffusion regions 14 for contacting th p-type well 9 are formed independently between each two adjacent basic cells 11. In each of the diffusion regions 14 and 15, the symbol "X" denotes an ohmic contact for connection to the power line of $V_{DD}$ or $V_{SS}$. As is clear from FIG. 5, the existence of the ohmic contact X at each diffusion region (14, 15) increases the width of the regions and, in this sense impedes higher packing density of the basic cells.

Figure 6A:
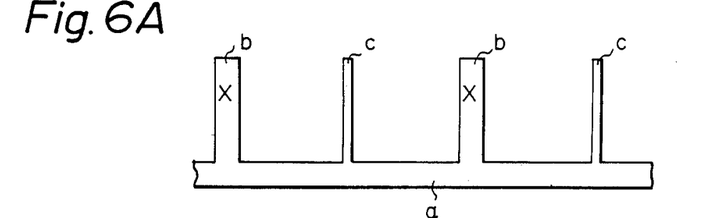
FIGS. 6A and 6B are top plan views of basic structures of a first type diffusion region and a second type diffusion region according to the present invention.
Figure 6B:
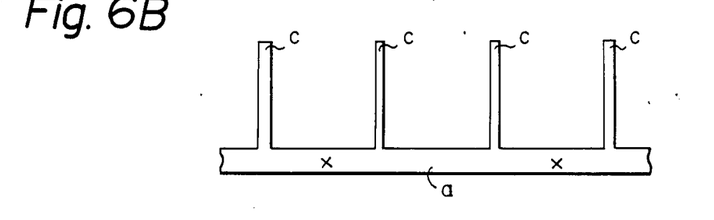

FIGS. 6A and 6B are top plan views of structures of a first type diffusion region and second type diffusion region according to the present invention. As apparent from FIGS. 6A and 6B, the diffusion regions of the present invention for contact with the n-type silicon substrate and the p-type well are comb-shaped in overall structure. In FIG. 6A, the first type comb-shaped diffusion region is shaped with a base part a, wide tooth parts b, and narrow tooth parts c. Each wide tooth part b contains an ohmic contact X for contact with the power line. In FIG. 6B, the second type comb-shaped diffusion region is shaped with the base part a and the narrow tooth parts c. The base part a contains the ohmic contacts X in FIG. 6B.

In FIGS. 6A and 6B, it is important to note that all of the diffusion regions 14, 15 (FIG. 6B) at least or some of the diffusion regions 14, 15 (FIG. 6A) are replaced with the narrow tooth parts c. In this case, the narrow tooth parts are still supplied with power from the ohmic contacts X via the base part a (FIG. 6B) or via both the wide tooth parts b and the base part a (FIG. 6A). Accordingly, every two adjacent basic cells straddling a narrow tooth part c can be located closer to each other than those straddling the wide diffusion regions 14, 15 as in FIG. 5. This makes it possible to pack the basic cells with higher density than in the prior art.

Figure 7A:
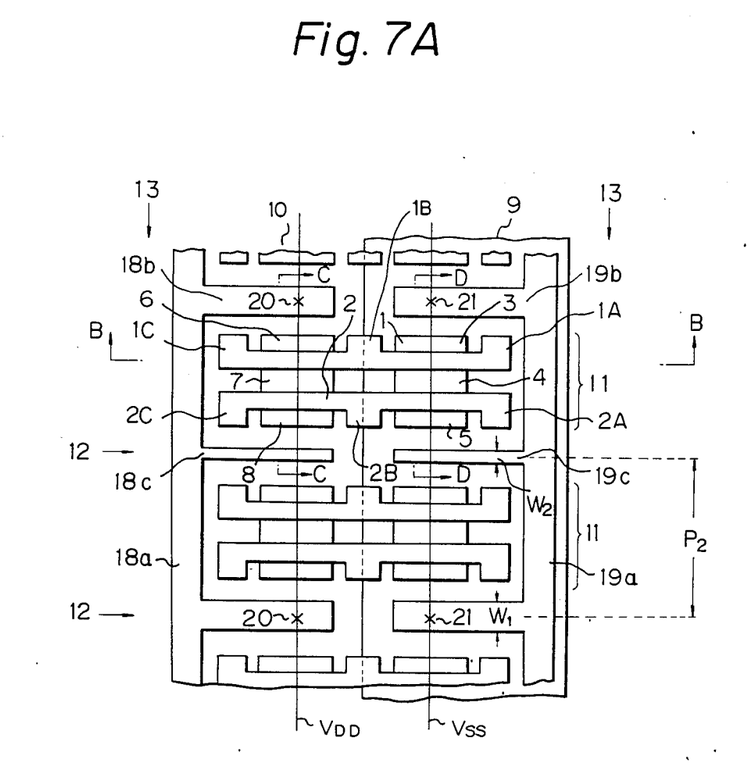
FIG. 7A is an enlarged top plan view of a partial basic cell array according to a first embodiment of the present invention.
Figure 7B:
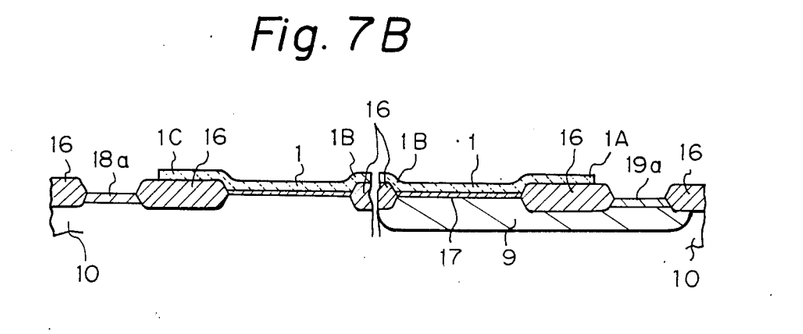
FIG. 7B is an enlarged cross-sectional view taken along line B—B of FIG. 7A.
Figure 7C:
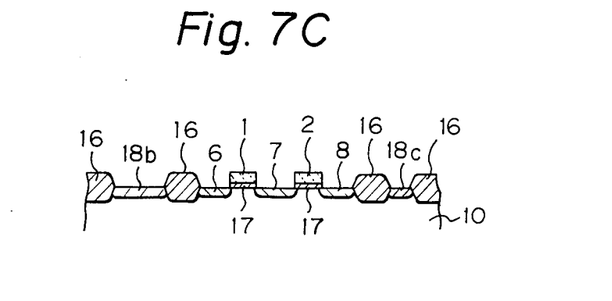
FIG. 7C is an enlarged cross-sectional view taken along line C—C of FIG. 7A.
Figure 7D:
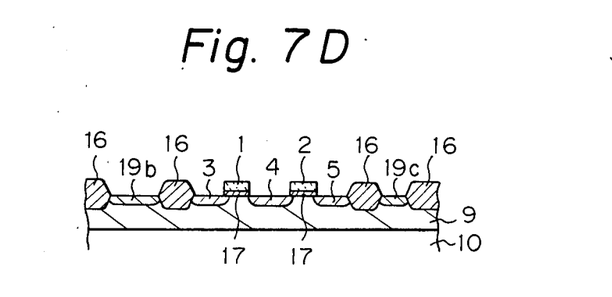
FIG. 7D is an enlarged cross-sectional view taken along line D—D of FIG. 7A.

FIG. 7A is an enlarged top plan view of a partial basic cell array according to a first embodiment of the present invention. FIG. 7B is an enlarged cross-sectional view taken along line B—B of FIG. 7A. FIG. 7C is an enlarged cross-sectional view taken along line C—C of FIG. 7A. FIG. 7D is an enlarged cross-sectional view taken along line D—D of FIG. 7A. Members 1 through 13 in FIGS. 7A through 7D, have already been described. Reference numerals 1A, 1B, and 1C represent three different terminal electrodes provided by the first gate electrode wiring layer 1. Similarly, 2A, 2B, and 2C represent three different terminal electrodes provided by the second gate electrode wiring layer 2. Reference numeral 16 represents an isolation layer for separation and 17 a gate insulation layer. Reference numeral 18 represents an n+-diffusion region for contact with the n-type silicon substrate 10, and reference numeral 19 represents a p+-diffusion region for contact with the p-type well 9. Both regions 18 and 19 are features of the present invention. To be specific, reference numeral 18a represents a base part of the region 18, 18b wide tooth parts of the region 18, and 18c narrow tooth parts of the region 18. Thus, the members 18a, 18b, and 18c form the comb-shaped n+-diffusion region 18. The base part 18a has a belt-like shape and is on the order of several μm in width for a relatively low resistance value. Each of the wide tooth parts 18b is on the order of several μm in width for contact with the power line of $V_{DD}$ through an individual ohmic contact (X) window 20, usually formed in an insulation layer made of, for example, phospho-silicate glass (PSG) formed over the basic cells. Each of the narrow tooth parts 18c is as narrow as possible, i.e., the minimum width possible using current semiconductor manufacturing techniques. Similarly, reference numeral 19a represents a base part of the region 19, 19b wide tooth parts of the region 19, and 19c narrow tooth parts of the region 19. Thus the members 19a, 19b, and 19c form the comb-shaped p+-diffusion region 19. The base part 19a has a belt-like shape and is on the order of several μm in width for a relatively low resistance value. Each of the wide tooth parts 19b is on the order of several μm in width for contact with the power line of $V_{SS}$ through an individual ohmic contact (X) window 21 identical to the window 20. Each of the narrow tooth parts 19c is as narrow as possible, i.e., the minimum width possible using current semiconductor manufacturing techniques.

Each part of the n+- and p+-diffusion regions 18 and 19 is formed to be about several thousand Å in depth, almost the same as that of each source and drain 3-8 of the CMIS transistors comprising each basic cell 11. Further, as seen from FIG. 7A, the wide tooth parts 18b and 19b are located in the column direction with a pitch corresponding to two successive basic cells 11; in other words, two basic cells 11 are formed between successive wide tooth parts 18b and 19b. The wide tooth parts 18b and 19b may also be located at a pitch corresponding to three or more successive basic cells 11 so long as the capability of suppressing latchup is maintained.

According to the first embodiment of the present invention, the basic cells 11 can be densely packed while maintaining a capability for suppressing latchup comparable with the prior art for each basic cell 11 sandwiched by two tooth parts (18b, 18c; 19b, 19c) located closely thereto.

The base, wide tooth, and narrow tooth parts (18a, 18b, 18c) of the n+ type can be manufactured at the same time as the source and drain of the n-channel MIS transistors nMIS. Similarly, the base, wide tooth, and narrow tooth parts (19a, 19b, 19c) of the p+ type can be manufactured at the same time as the source and drain of the p-channel MIS transistors pMIS.

Figure 8:
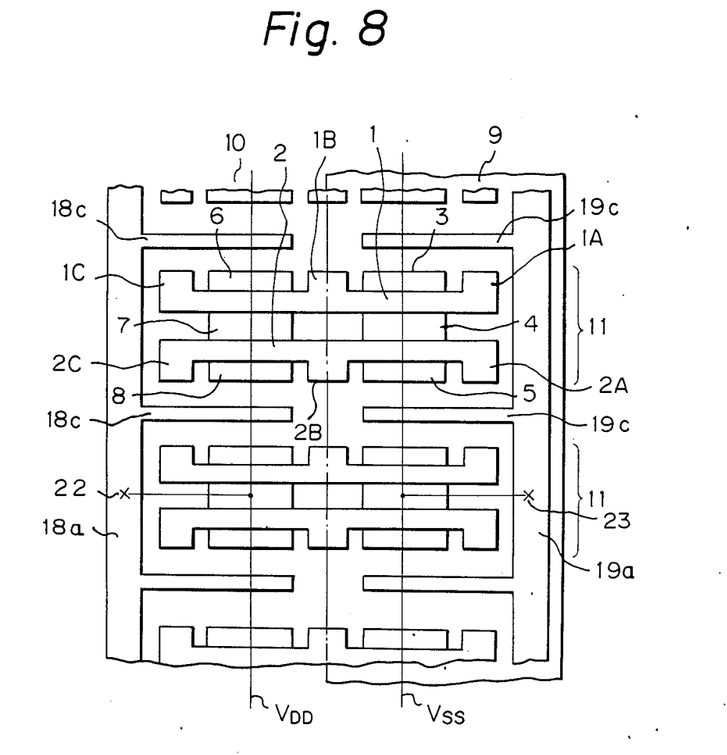
FIG. 8 is an enlarged top plan view of a partial basic cell array according to a second embodiment of the present invention.

FIG. 8 is an enlarged top plan view of a partial basic cell array according to a second embodiment of the present invention. This figure corresponds to FIG. 7A of the first embodiment. The embodiment illustrated in FIG. 8 is substantially the same as FIG. 7A. The differences here are that the tooth parts are all formed by the narrow tooth parts 18c and 19c, that is, the wide tooth parts 18b and 19b are not present. Therefore, the ohmic contact (X) windows 22 and 23 are formed above the base parts 18a and 19a, respectively. Incidentally, while the second embodiment (FIG. 8) is superior to the first embodiment from the viewpoint of a higher packing density of the basic cells 11 since there are no wide tooth parts 18b and 19b, it is inferior to the first embodiment from the point of view of design freedom for producing the desired LSI circuit, because the wirings between the power lines and the ohmic contact windows impede free distribution of the desired interconnecting lines.

Figure 9:
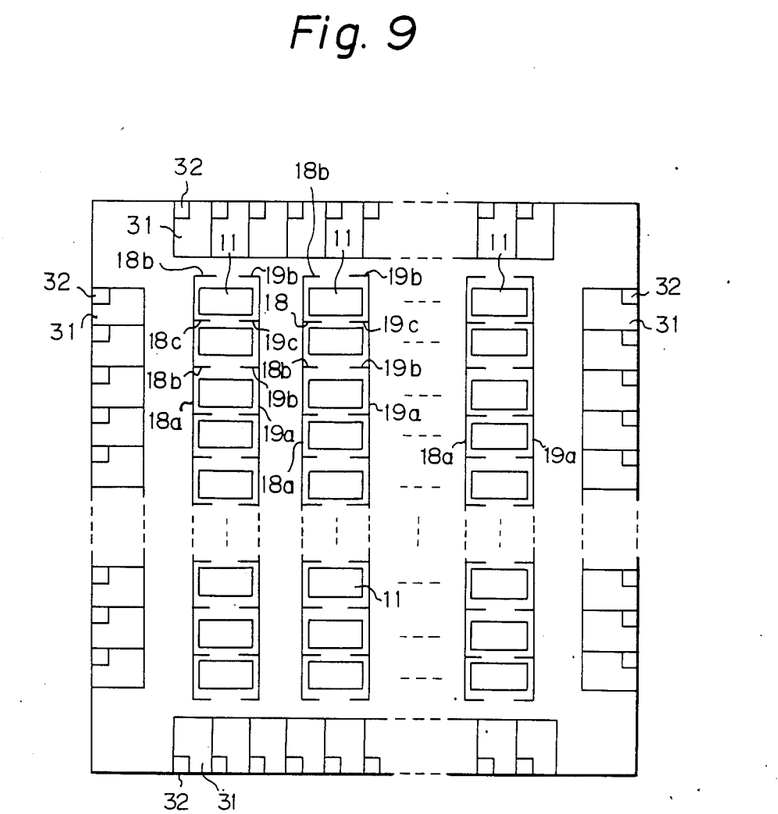
FIG. 9 is a top plan view of an example of a gate array type semiconductor IC device including the diffusion regions according to the first embodiment of FIG. 7A.

FIG. 9 is a schematic top plan view of an example of a gate array type semiconductor integrated circuit device including the comb-shaped diffusion regions 18 and 19 according to the first embodiment of FIG. 7A. There are many basic cell arrays inside the semiconductor chip. Each basic cell array is, as a whole, almost surrounded by the n+-diffusion regions 18a, 18b, 18c and the p+-diffusion regions 19a, 19b, 19c. There are many peripheral circuits outside the basic cell arrays. Each peripheral circuit is chiefly comprised of an interface circuit 31 for interface operation between external circuits and an input/output electrode pad 32.

Finally, some advantages of the present invention will be given below with reference to FIG. 9. If the semiconductor chip of FIG. 9 has a size of 10 mm×10 mm, the length of each basic cell array in the column direction may be 9.6 mm. With a length of 9.6 mm, if the prior art diffusion regions shown in FIG. 5 are utilized, 300 basic cells can be accommodated in each basic cell array. Since the pitch $P_1$ (refer to FIG. 5) between two successive diffusion regions 14 or 15 is usually about 32 μm and the width $W_1$ (refer to FIG. 5) of each diffusion region is about 4 μm, the expression 300×32 (μm)=9.6 (mm) results in the above length for a basic cell array. Contrary to the above, according to the present invention, while the width $W_1$ (refer to FIG. 7A) of each wide tooth part 18b and 19b is about 4 μm as in the prior art, the width $W_2$ (refer to FIG. 7A) of each narrow tooth part 18c and 19c can be halved to about 2 μm. Therefore, the pitch $P_2$ (refer to FIG. 7A) between two successive diffusion regions can be reduced to 30 μm. Thus, the pitch $P_2$ is 2 μm shorter than the pitch $P_1$ of the prior art. This means that about 600 μm (=2 μm×300) of chip space can be saved, according to the above mentioned example, in each basic cell array. It should be understood here that the thus saved chip space can accommodate 20 (=600/30) basic cells 11. Thus, a higher packing density of the basic cells is assured even though the length of the basic cell array remains 9.6 mm. Conversely, if the number of the basic cells in a column is kept constant, the chip size can be reduced.

As explained above in detail, a comb-shaped diffusion region 18 or 19 comprised of at least some narrow tooth parts 18c or 19c can save chip space for further additional basic cells 11. As previously mentioned, since a narrow tooth part can be inserted between two adjacent basic cells 11 many times along the length of the basic cell array, the thus saved chip space is sufficient to accommodate many additional basic cells 11 in each basic cell array.

We claim:

1. A gate array type semiconductor integrated circuit formed in a semiconductor substrate having a first conductivity type and having wells formed therein, the wells having a second conductivity type different than the first conductivity type, said device including first and second power lines extending in a column direction and comprising:

basic cell arrays, each extending in the column direction and arranged in a row direction with column spaces extending in the column direction and located between adjacent basic cell arrays, each basic cell array including basic cells arranged in the column direction with row spaces located between adjacent basic cells in each of said basic cell arrays, each of the basic cells having a first-channel MIS transistor formed in the semiconductor substrate and a second-channel MIS transistor formed in one of the wells;

first diffusion regions of the first conductivity type, formed only in the semiconductor substrate adjacent the first-channel MIS transistor in each of the basic cells, each of said first diffusion regions having a comb-shaped structure including:

a first base part extending in the column direction along a first side of a corresponding basic cell array in one of the column spaces; and first tooth parts forming an integral structure with said first base part, each of said row spaces in the corresponding basic cell array having one of said first tooth parts formed therein, said first tooth parts crossing underneath the first power line and including first narrow and first wide tooth parts, formed in narrow and wide row spaces, respectively, said first wide tooth parts including first ohmic contacts connected to the first power line; and second diffusion regions of the second conductivity type, formed only in the wells adjacent the second-channel MIS transistor in each of the basic cells, each of said second diffusion regions corresponding to one of said basic cell arrays and having a comb-shaped structure including:

a second base part extending in the column direction along a second side, opposite the first side, of the corresponding basic cell array in one of the column spaces; and second tooth parts forming an integral structure with said second base part, each of said row spaces in the corresponding basic cell array having one of said second tooth parts formed therein, said second tooth parts crossing underneath the second power line and including second narrow and second wide tooth parts, formed in narrow and wide row spaces, respectively, said second wide tooth parts including second ohmic contacts connected to the second power line.

2. A gate array type semiconductor integrated circuit formed in a semiconductor substrate having a first conductivity type and having wells formed therein, the wells having a second conductivity type different than the first conductivity type, said device including first and second power lines extending in a column direction and comprising:

basic cell arrays, each extending in the column direction and arranged in a row direction with column spaces extending in the column direction and located between adjacent basic cell arrays, each basic cell array including basic cells arranged in the column direction with row spaces located between adjacent basic cells in each of said basic cell arrays, each of the basic cells having a first-channel MIS transistor formed in the semiconductor substrate and a second-channel MIS transistor formed in one of the wells;

first diffusion regions of the first conductivity type, formed only in the semiconductor substrate adjacent the first-channel MIS transistor in each of the basic cells, each of said first diffusion regions having a comb-shaped structure including:

a first base region, having a first width, extending in the column direction along a first side of a corresponding basic cell array in one of the column spaces and having at least one ohmic contact connected to the first power line; and first tooth parts, having a second width narrower than the first width, forming an integral structure with said first base part, each of the row spaces in the corresponding basic cell array having a first tooth part formed therein; and second diffusing regions of the second conductivity type, formed only in the wells adjacent the second-channel MIS transistor in each of the basic cells, each of said second diffusion regions corresponding to one of said basic cell arrays and having a comb-shaped structure including:

a second base part, having the first width, extending in the column direction along a second side, opposite the first side, of the corresponding basic cell array in one of the column spaces and having at least one ohmic contact connected to the second power line; and second tooth parts, having the second width, forming an integral structure with said second base part, each of the row spaces in the corresponding basic cell array having a second tooth part formed therein.

* * * * *